(12) United States Patent
Schloesser et al.

(10) Patent No.: US 9,034,753 B2
(45) Date of Patent: May 19, 2015

(54) METHOD OF FORMING CONDUCTIVE CONTACTS ON A SEMICONDUCTOR DEVICE WITH EMBEDDED MEMORY AND THE RESULTING DEVICE

(75) Inventors: Till Schloesser, Dresden (DE); Peter Baars, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 848 days.

(21) Appl. No.: 13/164,272

(22) Filed: Jun. 20, 2011

(65) Prior Publication Data
US 2012/0322225 A1    Dec. 20, 2012

(51) Int. Cl.
| H01L 21/4763 | (2006.01) |
|---|---|
| H01L 27/108 | (2006.01) |
| H01L 21/768 | (2006.01) |

(52) U.S. Cl.
CPC .... *H01L 27/10894* (2013.01); *H01L 21/76895* (2013.01); *H01L 21/76816* (2013.01); *H01L 27/10814* (2013.01); *H01L 27/10855* (2013.01); *H01L 27/10888* (2013.01)

(58) Field of Classification Search
CPC ............ H01L 21/486; H01L 21/76804; H01L 21/76805; H01L 21/76807; H01L 21/76808; H01L 21/7681; H01L 21/76816; H01L 21/76877; H01L 21/76879; H01L 21/7688; H01L 21/76882; H01L 21/76897; H01L 29/665; H01L 23/481; H01L 23/49827; H01L 23/5226

USPC ......... 438/254, 304, 305, 311, 329, 386–387, 438/397, 629, 637–640, 668, 672, 675; 257/E29.119, E23.011, E23.145, 257/E21.577–E21.579, E21.585, E21.586
See application file for complete search history.

(56) References Cited

U.S. PATENT DOCUMENTS

| 5,998,252 | A | 12/1999 | Huang |
|---|---|---|---|
| 6,177,304 | B1 | 1/2001 | Li et al. |
| 6,248,623 | B1 | 6/2001 | Chien et al. |
| 6,486,033 | B1 | 11/2002 | Tu et al. |
| 6,727,543 | B2 | 4/2004 | Lin |
| 7,193,277 | B2 | 3/2007 | Sadra et al. |
| 7,323,379 | B2 | 1/2008 | Sinitsky et al. |
| 7,999,298 | B2 | 8/2011 | Kavalieros et al. |
| 2004/0232558 | A1* | 11/2004 | Toda .............................. 257/774 |
| 2009/0004842 | A1* | 1/2009 | Lee ................................ 438/618 |

* cited by examiner

*Primary Examiner* — Calvin Choi
(74) *Attorney, Agent, or Firm* — Amerson Law Firm, PLLC

(57) ABSTRACT

A method is disclosed that includes forming a conductive logic contact in a logic area of a semiconductor device, forming a bit line contact and a capacitor contact in a memory array of the semiconductor device, and performing at least one first common process to form a first metallization layer comprising a first conductive line in the logic area that is conductively coupled to the conductive logic contact and a bit line in the memory array that is conductively coupled to the bit line contact. The method further includes performing at least one second common process to form a second metallization layer comprising a first conductive structure conductively coupled to the first conductive line in the logic area and a second conductive structure in the memory array that that is conductively coupled to the capacitor contact.

15 Claims, 5 Drawing Sheets

METHOD OF FORMING CONDUCTIVE CONTACTS ON A SEMICONDUCTOR DEVICE WITH EMBEDDED MEMORY AND THE RESULTING DEVICE

BACKGROUND

1. Field of the Disclosure

Generally, the present disclosure relates to sophisticated integrated circuits, and, more particularly, to methods of forming conductive contacts on a semiconductor device with embedded memory, and a novel device structure.

2. Description of the Related Art

In modern ultra-high density integrated circuits, device features have been steadily decreasing in size to enhance the performance of the semiconductor device and the overall functionality of the circuit. However, commensurate with the on-going shrinkage of feature sizes, certain size-related problems arise that may at least partially offset the advantages that may be obtained by simple size reduction alone. In general, decreasing the size of, for instance, circuit elements such as MOS transistors and the like, may lead to superior performance characteristics due to a decreased channel length of the transistor element, thereby resulting in higher drive current capabilities and enhanced switching speeds. Upon decreasing channel length, however, the pitch between adjacent transistors likewise decreases, thereby limiting the size of the conductive contact elements—e.g., those elements that provide electrical connection to the transistor, such as contact vias and the like—that may fit within the available real estate. Accordingly, the electrical resistance of conductive contact elements becomes a significant issue in the overall transistor design, since the cross-sectional area of these elements is similarly decreased. Moreover, the cross-sectional area of the contact vias, together with the characteristics of the materials they comprise, may have a significant influence on the effective electrical resistance and overall performance of these circuit elements.

Thus, improving the functionality and performance capability of various metallization systems has become important in designing modern semiconductor devices. One example of such improvements is the enhanced use of copper metallization systems in integrated circuit devices and the use of so-called "low-k" dielectric materials (materials having a dielectric constant less than 3) in such devices. Copper metallization systems exhibit improved electrical conductivity as compared to, for example, prior art metallization systems using tungsten for the conductive lines and vias. The use of low-k dielectric materials also tends to improve the signal-to-noise ratio (S/N ratio) by reducing crosstalk as compared to other dielectric materials with higher dielectric constants. However, the use of such low-k dielectric material can be problematic as they tend to be less resistant to metal migration as compared to some other dielectric materials.

FIG. 1 is a simplified and schematic cross-sectional view of an illustrative semiconductor device 100, i.e., a device that includes an illustrative eDRAM (embedded dynamic random access memory) device, for discussion purposes. As depicted therein, the device is formed in and above a substrate 102 and it generally includes a logic area 104, where various logic devices are formed, and a memory array 106, where various memory elements are formed. The logic area 104 and the memory array 106 are separated by an isolation structure, such as an illustrative trench isolation structure 108. The memory array 106 includes, among other things, electrical contacts 105L in the logic area 104, electrical contacts 105M in the memory array 106, and a plurality of schematically depicted capacitors 110 (e.g., single or double sided capacitors) that are electrically coupled to a plate contact 111. The capacitors 110 are formed in a layer 112 of a non-low-k dielectric material (a material having a dielectric constant greater than 3), e.g., silicon dioxide, that is formed above the surface of the substrate 102. As is common, electrical connection to the logic area 104 of the device is made by an extended length contact 114. In the embodiment depicted in FIG. 1, the capacitors 110 in the memory array 106 are formed prior to forming the extended length contact 114.

An etch stop layer 116 is formed above the layer 112 and copper-based metallization components, e.g., metal lines 118 and vias 120, are formed to provide electrical connection to the logic area 104 and the memory array 106. The copper-based metallization components are formed in a dielectric material layer 122 that is typically comprised of a low-k material to enhance the performance of the copper-based metallization components. Typically, the extended length contact 114 is comprised of a conductive material such as tungsten. The aspect ratio of the extended length contact 114 is typically very high and may be on the order of 15-20. Such high aspect ratio openings cannot be readily filled with copper. Moreover, given the difficulty in filling high aspect ratio openings with any material, the aspect ratio of the opening for the extended length contact 114 tends to limit the height of the capacitors 110 in the memory array 106.

One problem that has arisen with the modern devices as device dimensions continue to shrink, is that it is very difficult to fit contact vias in and among the various other structures of the device such as the bit lines and word lines in the memory array 106. All other things being equal, device designers would prefer to have spacing between the bit lines and word lines be as small as possible to shrink the overall size of the memory cell. However, as noted above, this continual reduction in cell size tends to make contact integration schemes very difficult and complex.

There are several other undesirable aspects of the illustrative device 100 depicted in FIG. 1. First, the use of the non-copper extended length contact 114 may reduce the operating efficiency of the device 100 as compared to how the device 100 would operate if copper could be used for the extended length contact 114. Additionally, the use of the higher k dielectric material in the layer 112, which tends to be helpful as it relates to the performance of the capacitors 110, tends to be detrimental as to the signal-to-noise ratio of the device 110.

Some efforts in the past have been made to alleviate the problem of the extended length contact 114 in the logic area 104. For example, bit lines in the memory array 106 have been made at the same time as the so-called metal-1 structures in the logic array 104. Unfortunately, this approach tends to require relatively large spacing between the bit lines which tends to increase the overall cell size.

The present disclosure relates to methods and devices for avoiding or at least reducing the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein relates to methods of forming conductive contacts on a semiconductor device with embedded memory, and a novel device structure. A method is disclosed that includes forming a conductive logic contact in a logic area of a semiconductor device, forming a bit line contact and a capacitor contact in a memory array of the semiconductor device, and performing at least one first common process to form a first metallization layer comprising a first conductive line in the logic area that is conductively coupled to the conductive logic contact and a bit line in the memory array that is conductively coupled to the bit line contact. The method further includes performing at least one second common process to form a second metallization layer comprising a first conductive structure conductively coupled to the first conductive line in the logic area and a second conductive structure in the memory array that that is conductively coupled to the capacitor contact.

Another illustrative method includes forming a conductive logic contact in a logic area of a semiconductor device, forming a bit line contact and a capacitor contact in a memory array of the semiconductor device and performing at least one common process to form a conductive line in the logic area that is conductively coupled to the conductive logic contact and to form a bit line in the memory array that is conductively coupled to the bit line contact, wherein the conductive line and the bit line are positioned at least partially within a first layer of insulating material. The method further involves forming at least one additional layer of insulating material above the conductive line in the logic area and above the bit line in the memory array, performing at least one etching process to define an opening that extends through the additional layer of insulating material and the first layer of insulating material and exposes the capacitor contact in the memory array, and forming a conductive structure in the opening that is conductively coupled to the capacitor contact.

BRIEF DESCRIPTION OF THE DRAWINGS

The disclosure may be understood by reference to the following description taken in conjunction with the accompanying drawings, in which like reference numerals identify like elements, and in which.

Figure 1:
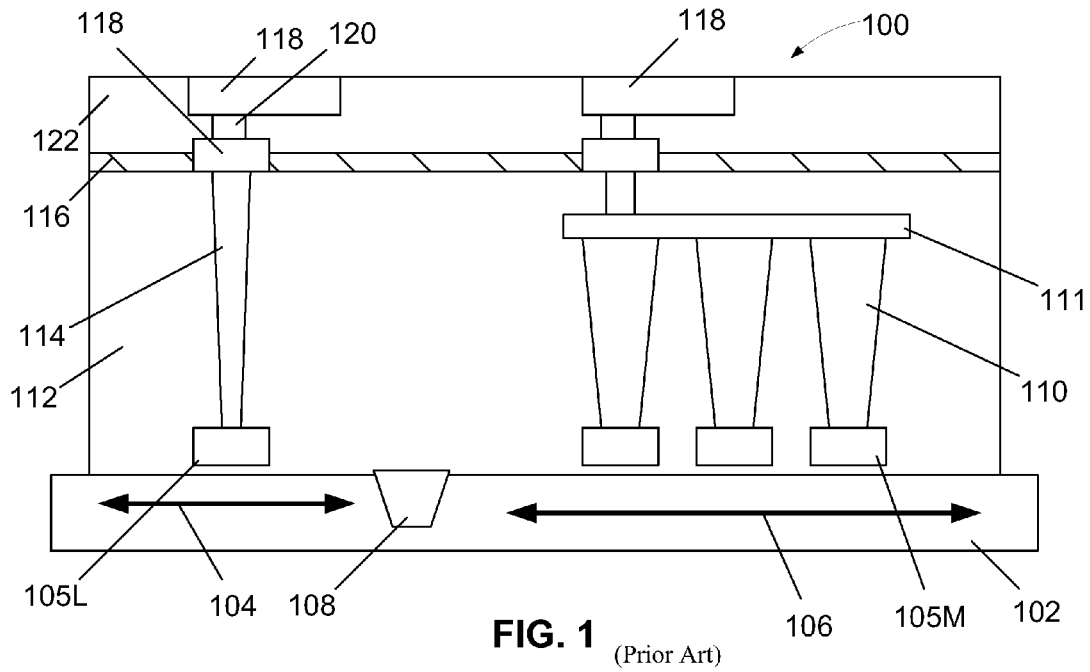
FIG. 1 schematically illustrates an illustrative prior art semiconductor device including a logic area and a memory array with a plurality of capacitor structures formed therein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIGS. 2A-2H depict one illustrative process flow for forming the illustrative semiconductor device 200 disclosed herein above a semiconducting substrate 202. The substrate 202 may have a variety of configurations, such the depicted bulk silicon configuration. The substrate 202 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all semiconductor structures. The substrate 202 may also be made of materials other than silicon.

Figure 2A:
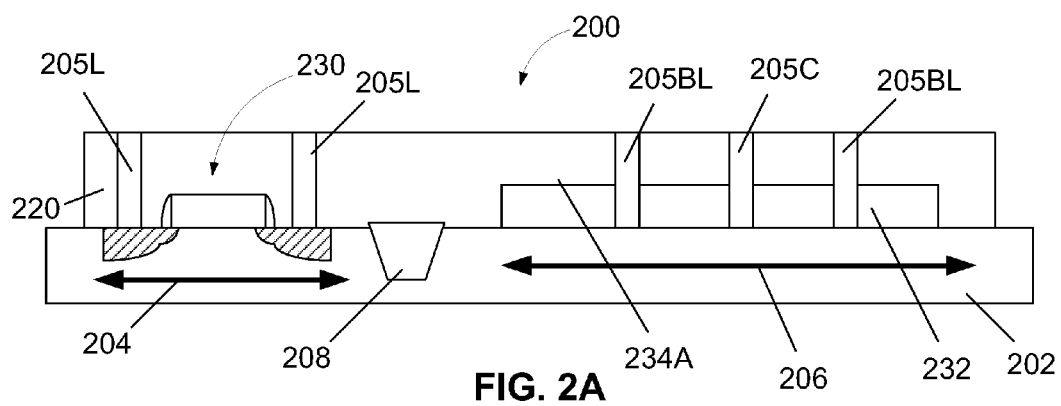
FIGS. 2A-2H depict one illustrative process flow for forming the semiconductor device disclosure herein.

FIG. 2A is a schematic, cross-sectional view of the semiconductor device 200 disclosed herein at an early stage of manufacture. As shown therein, the device 200 includes a logic area 204 and a memory array 206 that are separated by an isolation structure, such as a shallow trench isolation 208. An illustrative transistor 230, with source/drain regions, is schematically depicted in the logic area 204. An illustrative word line 232 is depicted in the memory array 206.

Also depicted in FIG. 2A are a plurality of logic contacts 205L in the logic area 204, a plurality of bit line contacts 205BL in the memory array 206, and an illustrative capacitor contact 205C in the memory array 106. The capacitor contact 205C may be electrically coupled to an access transistor (not shown) formed in the memory array 206. The various contacts 205L, 205BL and 205C are formed in a first layer of insulating material 220 that may be comprised of, for example, silicon dioxide, having a thickness of 100-200 nm, depending on the height of the transistor gate electrode and the height of the contacts. The contacts 205L, 205BL and 205C may be formed of a variety of materials, such as tungsten, and they may be formed by performing known techniques.

It should also be noted that the contacts 205L, 205BL and 205C are depicted as lying in the same plane in the cross-sectional view depicted in FIG. 2A and in subsequent drawings. Typically that is not the case in real-world devices as at least the capacitor contact 205C tends to be offset from the bit line contacts 205BL due to limited space requirements. In the schematically depicted example depicted in FIG. 2A, the capacitor contact 205C may be positioned further back (i.e., further into the drawing page) on a real-world device. Nevertheless, for ease of explanation, the various contacts 205L, 205BL and 205C are depicted as lying in the same plane in the various cross sectional views depicted herein.

As will be recognized by those skilled in the art after a complete reading of the present application, the present invention may be employed in forming metallization layers to all or substantially all of the contacts 205L, 205BL and 205C. Moreover, the illustrative transistor 230 is not the only type of device to which such contacts may be made in the logic area 204. Thus, the schematic and simplified depictions herein of a limited number of contacts 205L, 205BL and 205C, and the illustrative transistor 230, should not be considered to be a limitation of the present invention.

Figure 2B:
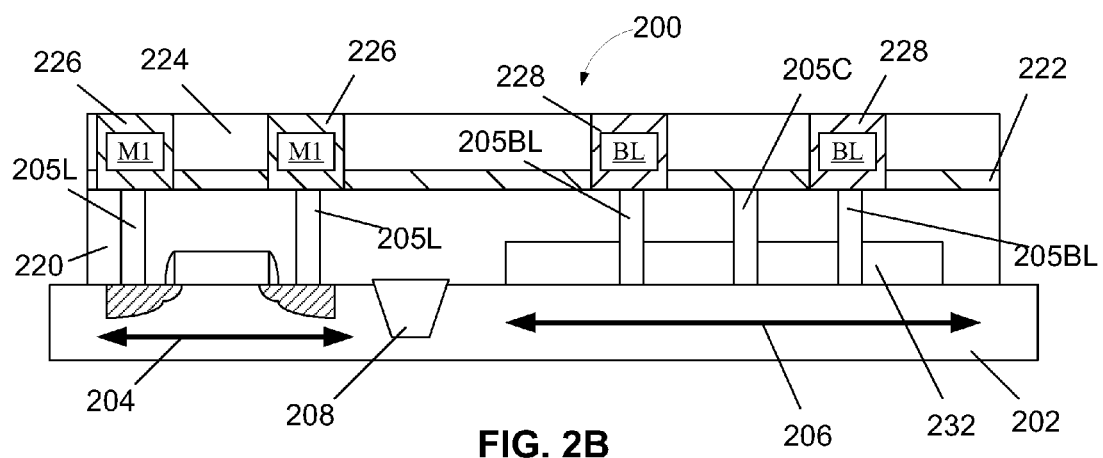

FIG. 2B depicts the semiconductor device 200 after several process steps have been performed. More specifically, the device 200 includes an etch stop layer 222, a second layer of insulating material 224, a plurality of so-called "metal-1" lines 226 (M1) and a plurality of bit lines 228 (BL). The lines 226 and the bit lines 228 may be considered to be part of a first metallization layer of the device 200. The etch stop layer 222 may be comprised of a material that is selectively etchable with respect to the first dielectric layer 220. In one illustrative embodiment, the etch stop layer 222 may be silicon nitride, silicon carbide, BLOCK™, or other similar materials, and it may have a thickness of 20-30 nm. The second layer of insulating material 224 may be comprised of a material that is selectively etchable with respect to the etch stop layer 222 and perhaps the first dielectric layer 220. In one illustrative embodiment, second layer of insulating material 224 may be comprised of, for example, a low-k material (made from a material having a dielectric constant (k) value less than 3), a carbon-doped silicon oxide, etc. and it may have a thickness of 100-150 nm. As will be described more fully below, the device 200 includes additional layers of insulating material and additional etch stop layers. These additional layers of insulating material need not all be of the same material or the same thickness as the first or second layers of insulating material, although they may be. Similarly, the additional etch stop layers need not all be of the same material or the same thickness as the illustrative etch stop layer 222 shown in FIG. 2B, although they may be. The first and second layers of insulating material 220, 224 and the etch stop layer 222 and all subsequently discussed layers of material may be formed using a variety of known deposition techniques, such as chemical vapor deposition (CVD), plasma enhanced chemical vapor deposition (PECVD), atomic layer deposition (ALD), etc.

The metal-1 structures 226 and the bit lines 228 may be formed at the same time using a common process. These structures may be formed by performing a variety of known techniques such as metal deposition followed by a chemical mechanical planarization (CMP) process to remove excess material positioned above the second layer of insulating material 224. For clarity, various other layers associated with the formation of the structures 226, 228, such as barrier metal layers and the like, are not depicted in the drawings. In one illustrative example, the metal-1 structures 226 and the bit lines 228 are comprised of copper that are formed using a single damascene process. Note that, during the formation of the bit lines 228, the underlying capacitor contact 205C is not exposed at this point in the process.

Figure 2C:
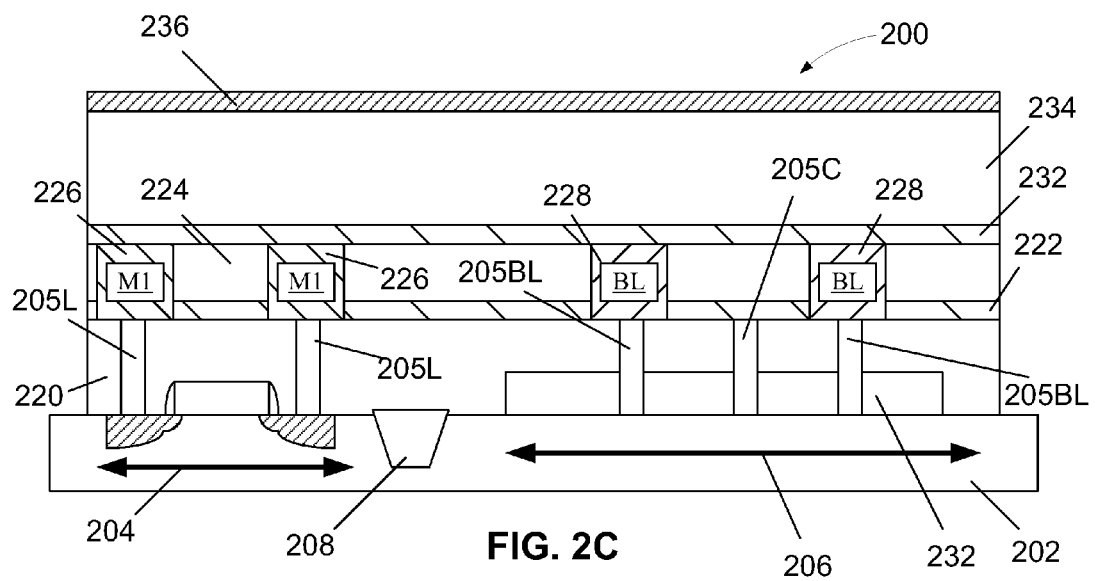

FIG. 2C depicts the device 200 at a point where an additional etch stop layer 232, a third layer of insulating material 234 and a mask layer 236 have been formed above the first metallization layer of the device 200. The etch stop layer 232 may be comprised of the same or different materials as the etch stop layer 222. Similarly, the third layer of insulating material 234 may be comprised of material similar to those noted above for the second layer of insulating material 224, e.g., a low-k material. In one illustrative embodiment, the third layer of insulating material 234 may have a thickness of approximately 150-200 nm. The mask layer 236 may be a hard mask comprised of a variety of materials, such as a metal like titanium nitride, or any other material suitable to function as a mask for this application, and it may have a thickness of approximately 15-20 nm.

Figure 2D:
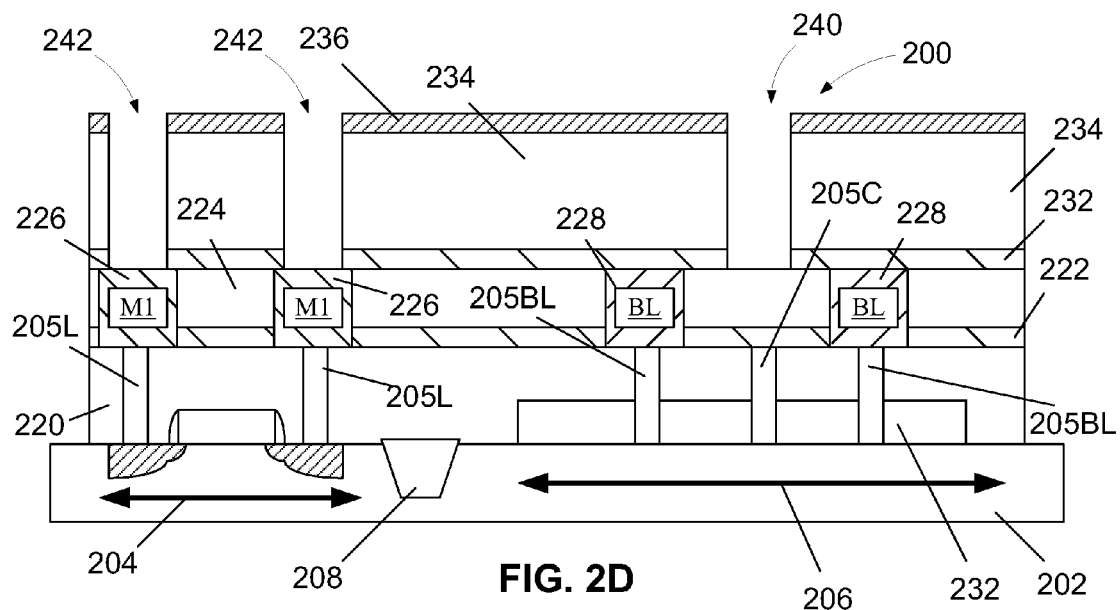

Next, as shown in FIG. 2D, various photolithography and etching operations have been performed to define a plurality of first openings 242 in the logic area 204 that expose the metal-1 structures 226 of the first metallization layer. These operations also result in the formation of an illustrative second opening 240 in the memory array 206 that is positioned vertically above the capacitor contact 205C. At this time, the depths of the openings 242, 240 are approximately the same. The photo-mask and associated etching steps are not depicted in the drawings so as not to obscure the present invention. The openings 242, 240 may be formed by performing known etching techniques, e.g., dry anisotropic etching techniques, and may involve performing one or more etching steps using different etch chemistries. The size, shape, number and configuration of the openings 240, 242 may vary depending upon the particular application and the available plot space on the device 200.

Figure 2E:
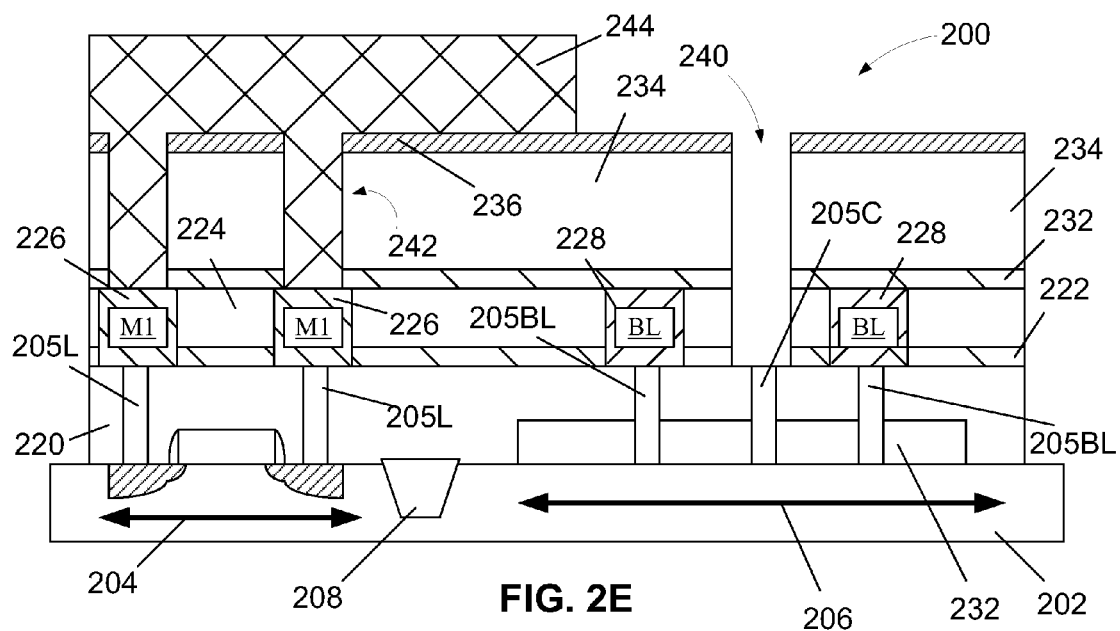

Next, as shown in FIG. 2E, a mask 244, e.g., a block mask, is formed above the device 200 so as to cover and fill the first openings 242 formed in the logic area 204 of the device. This block mask 244 may be formed using traditional photolithography materials and techniques. After the block mask 244 is formed, one or more etching processes are performed to further extend the depth of the second opening 240 in the memory array 206 such that the upper surface of the capacitor contact 205C is exposed. The second opening 240 may be extended by performing known etching techniques such as dry anisotropic etching process. Also note that the depth of the second opening 240 is now deeper than the depth of the first openings 242 in the logic area 204 of the device 200. In the illustrative example disclosed herein, this increased depth for the second opening 240 corresponds approximately to the thickness of the combined thickness of the first etch stop layer 222 and the second layer of insulating material 224. In the illustrative example described herein, the second opening 240 may be approximately 120-180 nm deeper than the first openings 242 in the logic area 204.

Figure 2F:
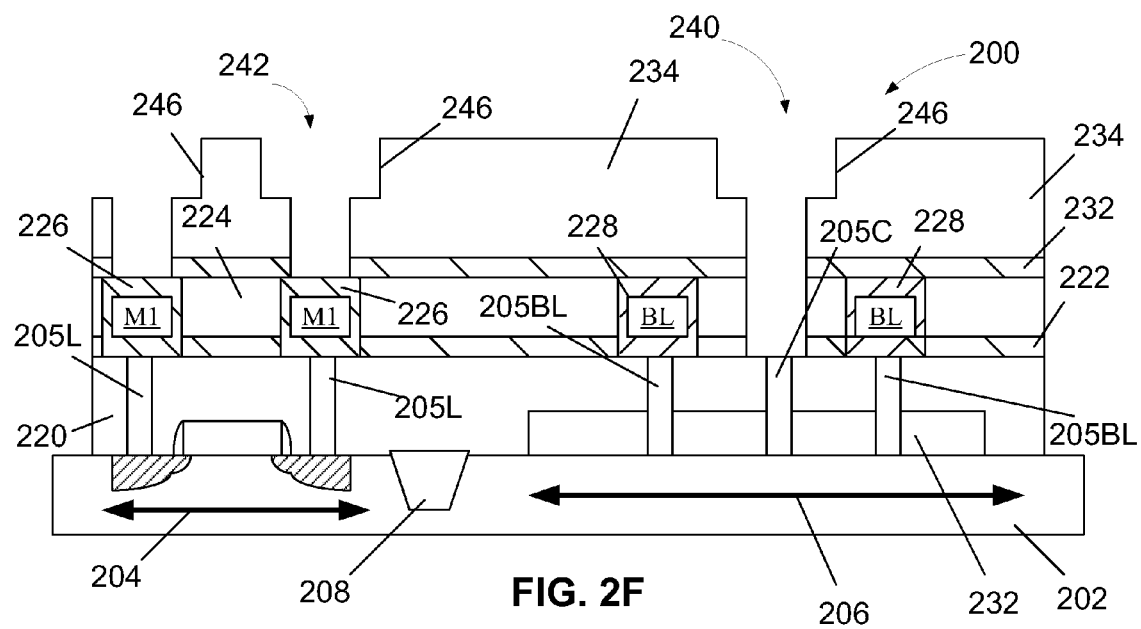

FIG. 2F depicts the device 200 at a point where additional photolithography and etching processes have been performed to define a plurality of trenches 246 in the third layer of insulating material to 234. The trenches 246 connect to the openings 240, 242.

Figure 2G:
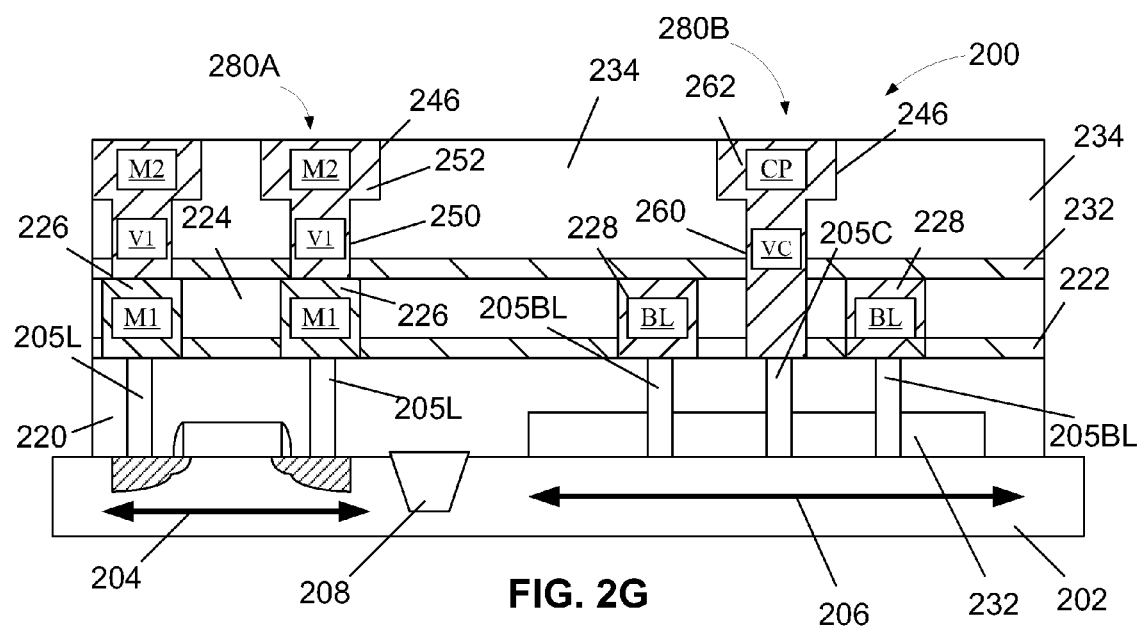

Next, as shown in FIG. 2G, various conductive structures are formed to fill the openings 240, 242 and trenches 246 using known damascene techniques. More specifically, a first conductive structure 280A is formed in the logic area 204 and it is conductively coupled to the metal lines 226 in the logic area that are positioned in the first metallization layer. The first conductive structure 280A includes the conductive via 250 (V1) and conductive lines 252 (M2). A second conductive structure 280B is formed in the memory array 206 and it is conductively coupled to the capacitor contact 205C that is positioned in the first layer of insulating material. The second conductive structure 280B includes conductive capacitor via 260 (VC) and a capacitor contact pad 262 (CP) that are formed in the memory array 206 of the device 200. These conductive structures made be made from a variety of materials such as, for example, copper. As noted, in the illustrative embodiment depicted herein, the conductive lines 252, the conductive vias 250, the conductive capacitor via 260 and the conductive contact pad 262 are formed in the same so-called metal-2 process. The first and second conductive structures 280A, 280B are included in the second metallization layer of the device 200. The conductive structures 280A, 280B may be formed in a common process.

Figure 2H:
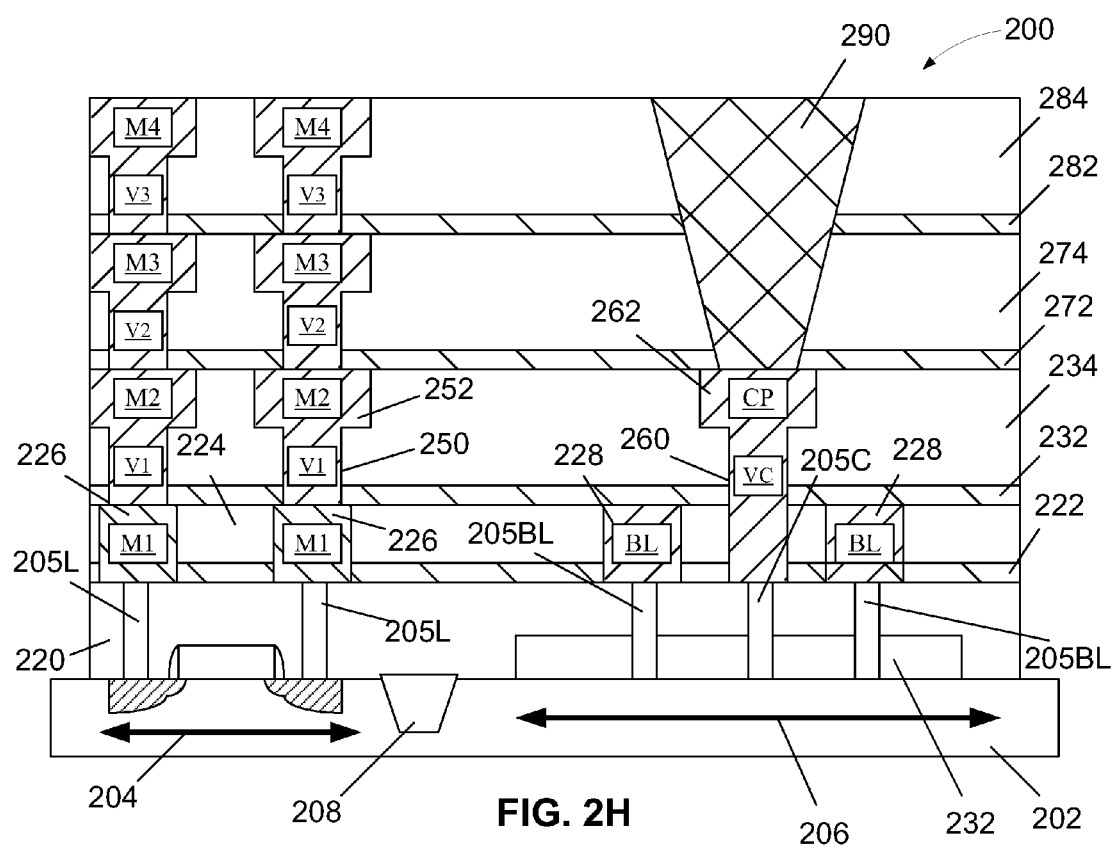

Next, as shown in FIG. 2H, additional metallization layers are formed above the logic area 204 of the device 200 using known techniques. More specifically, layers of insulating material 274, 284 and additional etch stop layers 272, 282 are formed above the device 200. Thereafter, by performing known photolithography, etching and deposition techniques, additional conductive structures (V2, M3, V3, M4) are formed in the various layers of material. The conductive structures in these additional metallization layers may also be comprised of a variety of materials such as, for example copper. Of course, the total number of metallization layers may vary depending on the particular device under construction.

Also depicted in FIG. 2H is a schematically depicted capacitor 290 that is conductively coupled to the capacitor contact pad 262. The capacitor 290 as depicted in FIG. 2H is intended to be generic in nature. The structure and manner in which capacitors are manufactured are well known to those of ordinary skill in the art. For example, the capacitor 290 may be either a single sided or a double-sided capacitor. An illustrative double sided capacitor would comprise first and second conductive layers (not shown) separated by an insulating material. The first conductive layer would conductively contact the capacitor contact pad 262 thereby establishing an electrical path (contact pad 262-conductive capacitor via 260-capacitor contact 205C) to a device (not shown) manufactured at the substrate level. Thus, the particular methods and structures disclosed used in forming such capacitors should not be considered to be a limitation of the present invention.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a conductive logic contact in a logic area of a semiconductor device;
   forming a bit line contact and a capacitor contact in a memory array of said semiconductor device;
   performing at least one common process to form a conductive line in said logic area that is conductively coupled to said conductive logic contact and to form a bit line in said memory array that is conductively coupled to said bit line contact, said conductive line and said bit line being positioned at least partially within a first layer of insulating material;
   forming at least one additional layer of insulating material above said conductive line in said logic area and above said bit line in said memory array;
   performing at least one etching process to define an opening that extends through said at least one additional layer of insulating material and said first layer of insulating material and exposes said capacitor contact in said memory array; and
   forming a conductive structure in said opening that is conductively coupled to said capacitor contact.

2. The method of claim 1, further comprising forming a capacitor that is conductively coupled to said conductive structure.

3. The method of claim 1, wherein said conductive structure comprises a conductive via and a capacitor contact pad positioned above said conductive via.

4. The method of claim 1 wherein said conductive structure is comprised of copper.

5. A method, comprising:
   forming a conductive logic contact in a logic area of a semiconductor device;
   forming a bit line contact and a capacitor contact in a memory array of said semiconductor device;
   performing at least one first common process to form a first metallization layer comprising a first conductive line in said logic area that is conductively coupled to said conductive logic contact and a bit line in said memory array that is conductively coupled to said bit line contact; and
   performing at least one second common process to form a second metallization layer comprising a first conductive structure conductively coupled to said first conductive line in said logic area and a second conductive structure in said memory array that that is conductively coupled to said capacitor contact.

6. The method of claim 5, wherein said conductive structure in said memory array comprises a conductive via and a capacitor contact pad positioned above said conductive via, wherein said capacitor contact is positioned proximate said conductive via.

7. The method of claim 5, further comprising forming a capacitor that is conductively coupled to said conductive structure in said memory array.

8. The method of claim 7, wherein said capacitor is at least one of a single sided or a double sided capacitor.

9. The method of claim 5, further comprising forming additional metallization layers above said second metallization layer in said logic area.

10. A method, comprising:
    forming a conductive logic contact in a logic area of a semiconductor device and a bit line contact and a capacitor contact in a memory array of said semiconductor device;
    performing at least one first common process to form a first metallization layer comprising a first conductive line in said logic area that is conductively coupled to said conductive logic contact and a bit line in said memory array that is conductively coupled to said bit line contact; said conductive line and said bit line being positioned at least partially within a first layer of insulating material;
    forming at least one additional layer of insulating material above said first metallization layer;
    performing at least one etching process to define a first opening through said first layer of insulating material in said logic area that exposes said first conductive line and a second opening through said first layer of insulating material in said memory array, said second opening being positioned above said capacitor contact;
    forming a masking layer at least above said first opening;
    after forming said masking layer, performing at least one etching process to extend a depth of said second opening through at least said first layer of insulating material and to thereby exposes said capacitor contact in said memory array, while masking said first opening;

forming a first conductive structure in said first opening that is conductively coupled to said first conductive line in said logic area; and forming a second conductive structure in said second opening that is conductively coupled to said capacitor contact.

11. The method of claim 10, wherein said second conductive structure in said memory array comprises a conductive via and a capacitor contact pad positioned above said conductive via, wherein said capacitor contact is positioned proximate said conductive via.

12. The method of claim 10, further comprising forming a capacitor that is conductively coupled to said second conductive structure.

13. The method of claim 10, wherein said first and second conductive structures are formed by performing at least one common process operation.

14. The method of claim 10, wherein, prior to extending said depth of said second opening, said first and second openings have approximately the same depth.

15. The method of claim 10, wherein said first layer of insulating material and said at least one additional layer of insulating material are comprised of a of low-k dielectric material.

* * * * *